US006058263A

United States Patent [19]

Voth

[11] Patent Number: 6,058,263

[45] **Date of Patent: *May 2, 2000**

[54] INTERFACE HARDWARE DESIGN USING INTERNAL AND EXTERNAL INTERFACES

[75] Inventor: David W. Voth, Woodinville, Wash.

[73] Assignee: Microsoft Corporation, Redmond, Wash.

[ * ] Notice: This patent issued on a continued prosecution application filed under 37 CFR 1.53(d), and is subject to the twenty year patent term provisions of 35 U.S.C. 154(a)(2).

[21] Appl. No.: 08/659,084

[22] Filed: Jun. 3, 1996

[51] Int. Cl.[7] .................................................. G06F 13/00

[52] U.S. Cl. .................... 395/500.46; 710/100; 710/102; 710/10; 710/8

[58] Field of Search .................................... 364/488–491, 364/260, 260.1, 260.2, 244.9; 395/500, 883, 884, 800.36, 800.37, 800.39, 830, 828, 831, 832, 500.46; 710/10, 8, 100, 102, 103, 104, 105

[56] References Cited

U.S. PATENT DOCUMENTS

| | | | |
|---|---|---|---|
| 5,245,703 | 9/1993 | Hubert | 710/240.8 |
| 5,343,516 | 8/1994 | Callele et al. | 379/93.05 |
| 5,432,925 | 7/1995 | Abraham et al. | 709/301 |
| 5,461,701 | 10/1995 | Voth | 358/1.1 |
| 5,519,851 | 5/1996 | Bender et al. | 710/102 |
| 5,537,415 | 7/1996 | Miller et al. | 370/314 |
| 5,537,607 | 7/1996 | Ploger, III | 710/10 |
| 5,577,213 | 11/1996 | Avery et al. | 710/100 |
| 5,581,669 | 12/1996 | Voth | 358/1.14 |
| 5,628,028 | 5/1997 | Michelson | 710/8 |
| 5,655,148 | 8/1997 | Richman et al. | 710/8 |
| 5,676,567 | 10/1997 | Gluskoter et al. | 439/638 |
| 5,708,799 | 1/1998 | Gafken et al. | 710/102 |
| 5,872,998 | 2/1999 | Chee | 395/876 |

FOREIGN PATENT DOCUMENTS

| | | |
|---|---|---|
| 0405765 | 1/1991 | European Pat. Off. . |
| 0685803 | 12/1995 | European Pat. Off. . |

OTHER PUBLICATIONS

Butts, M. Future Directions Of Dynamically Reprogrammable Systems Proceedings Of Custom Integrated Circuits Conference, Santa Clara, May 1–4, 1995.

"use of field–programmable gate array with fast memory to emulate an I/O interface", Technical Disclosure Bulletin, vol. 37, No. 4B, Apr. 1994, pp. 489–490.

*Primary Examiner*—Kevin J. Teska
*Assistant Examiner*—Vuthe Siek
*Attorney, Agent, or Firm*—Lee & Hayes, PLLC

[57] ABSTRACT

A computer system includes a plurality of discrete computer components and an integrated circuit that interfaces between the discrete computer components. The integrated circuit has internal hardware interfaces corresponding to respective discrete computer components. The internal hardware interfaces are selected from a limited number of available pre-defined internal hardware interfaces for general kinds of computer components. The internal hardware interfaces are accessible only within the integrated circuit. The integrated circuit further includes component-specific hardware interfaces for connecting the individual discrete components to the selected pre-defined internal HDL interfaces. The component-specific hardware interfaces are designed individually for the different discrete computer components to interface the discrete components to the internal hardware interfaces. A development system is disclosed for use during development of such a computer system. The development system includes interconnections that allow functions to be easily moved from the integrated circuit to a system CPU.

5 Claims, 8 Drawing Sheets

INTERFACE HARDWARE DESIGN USING INTERNAL AND EXTERNAL INTERFACES

TECHNICAL FIELD

This invention relates to development systems and methods for designing computer systems having multiple discrete components, and to the interface hardware that provides communications between discrete components in a computer system.

BACKGROUND OF THE INVENTION

A microprocessor-based system typically consists of a microprocessor connected to operate in conjunction with a variety of discrete peripheral computer components such as a microprocessor or CPU, different types of memory, UARTs, power management hardware, PCMCIA controllers, etc. Each component has a signal interface defined by a set of electrical contacts and by specified electrical and logical characteristics for those electrical contacts.

It is possible to design a microprocessor-based system in a way which allows for easy addition of components. The typical home PC is an example of such a system. It is expandable through a bus, to which add-on cards can be connected as long as the add-on cards are electrically compatible with the bus.

A disadvantage of bus-based systems is that they are not usually as compact as might otherwise be possible. When designing compact devices such as personal information managers, cell phones, palmtop computers, etc., expandability is often sacrificed for compactness. Components are highly integrated into as few chips as possible. In fact, it is becoming more and more common for functions to be integrated into a single chip along with a system CPU. This approach makes it difficult to change or add components.

This type of architecture also affects the development cycle. During typical development of a highly integrated system, components, features, and designs are selected only after much deliberation. This selection process generally precedes any actual hardware integration. Once the various selections are made, everything is integrated as much as possible. This is often done in a way that makes changes difficult—once something is designed in, it becomes interrelated with other system features at very low levels of design.

The interface logic between different discrete components is one reason why changes become difficult once a system is designed. Interface logic, commonly referred to as "glue logic," is necessary because different components typically have different signal interfaces. Interface logic is necessary to "translate" between the different interfaces. In modem designs, this logic is integrated on an application-specific integrated circuit (ASIC) such as a field-programmable gate array (FPGA). An example of a resulting system is shown in FIG. 1.

FIG. 1 shows a CPU 2 in combination with three peripheral components: a RAM memory component 3; a ROM memory component 4, and a serial communications component 5. An ASIC 6 is used to connect the various components so that they can communicate with each other.

ASIC 6 is configured in accordance with the logical and electrical characteristics of the various components' signal interfaces. This is commonly accomplished by configuring a number of individual ASIC external interfaces 7, each tailored specifically to work with its respective component. The ASIC external interfaces are also configured to work with each other, possibly using internal busses or data channels, so that communications between the components can take place. Using this approach, the interfaces and their connections to other interfaces are uniquely designed for every new product, in whatever way meets the particular designer's goals of time, cost, power consumption, etc. Once the design is complete, changes are difficult. The glue logic designed for one product is custom, and not easily used in another product.

Particularly when a gate array is used to implement interfaces between discrete components, the various functions of the gate array become so intertwined as to virtually preclude any significant modifications once the design effort is complete. Unless an expansion bus of some kind is implemented on the system, adding or changing peripheral components is a difficult design task.

SUMMARY OF THE INVENTION

The invention described below includes a development system and methods that facilitate the design of multi-component computer systems. The system includes development hardware on which an actual product can be designed and tested, using the same logic implementation that will be present in the finished design. The development hardware is configured in a way that allows the interface logic for a particular discrete component to be easily moved from a system gate array into the CPU.

The development system is configured with a programmable gate array that implements the same glue logic that will form part of the end design. The gate array has a standard or pre-defined internal configuration. The standard internal configuration includes a standard internal interface for each of the various discrete components. However, the internal interfaces have signals that are available only within the gate array. In order to connect to external components, component-specific specific interfaces are designed and implemented within the gate array for the various external components.

In the preferred embodiment of the invention, a limited number of internal interface types are pre-defined and used as standard interface types inside the gate array. Standard interconnection logic is provided for communications between the pre-defined internal interface types.

One of the internal interface types is selected for each external component. Then, a component-specific interface is specially designed for each component. The component-specific interface provides connection and interface translation between an external component and a corresponding internal interface of the gate array.

Flexibility in internal design is maintained by specifying certain internal features in terms of constants that can be set by a designer. For example, attributes of internal interfaces such as datapath width, address width, and address decoding can be specified by a designer without delving into the details of the pre-defined internal interfaces.

DETAILED DESCRIPTION

Development System

Figure 1:
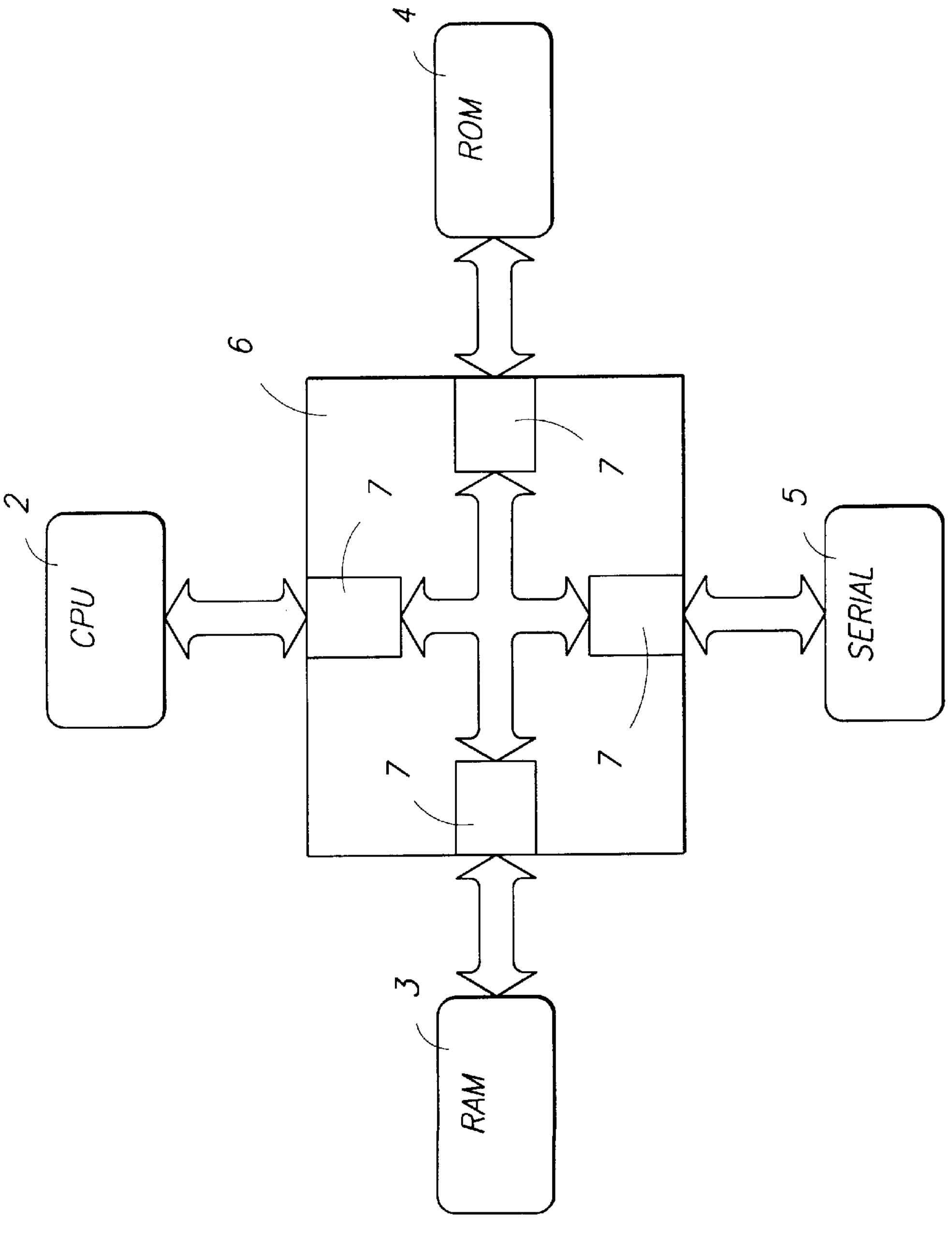
FIG. 1 is a block diagram of a prior art computer system.
Figure 2:
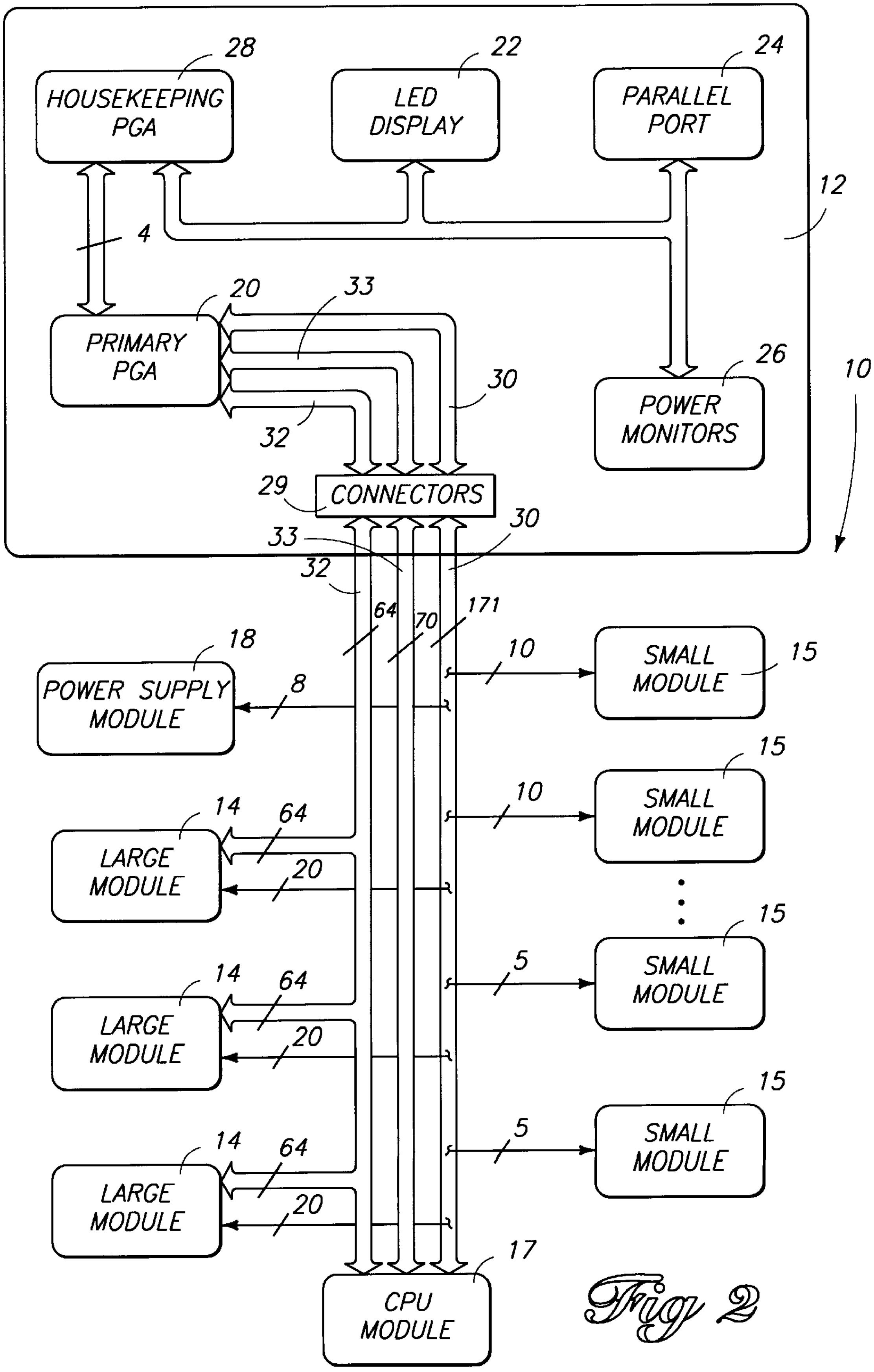
FIG. 2 is a block diagram of a development system in accordance with a preferred embodiment of the invention.

FIG. 2 shows components of a development system 10 in accordance with a preferred embodiment of the invention. Development system 10 comprises a logic or base module 12, a plurality of peripheral modules 14 and 15, a CPU module 17, and a power supply module 18. Base module 12 contains a primary field-programmable gate array (FPGA) 20 such as is to be used in the target system. Base module 12 further contains a number of support components—components that will not be part of the end product but which are useful during product development. The support components include an LED display 22, a conventional parallel port 24, power monitors 26, and a "housekeeping" gate array 28.

Base module 12 has a plurality of peripheral electrical connectors 29 to which the various modules are attached. During hardware and software development of a target system, each of peripheral modules 14 and 15, as well as power supply module 18 and CPU module 17, functions as one of the discrete components of the target system. For instance, a keyboard controller might be implemented on one module while a display controller might be implemented on another module. The modules can be removed, replaced, or altered as desired during target system development to emulate target system components.

FPGA 20 serves as a programmable component interface between the different discrete components of the target system and the CPU module—as glue logic. FPGA 20 has a plurality of interface or signal lines which are configurable by programming FPGA 20.

Each of the peripheral modules is connected through one or more of the electrical connectors 29 so that it can access a set of the FPGA signal lines. In the preferred embodiment, the signal lines from the FPGA are segregated into dedicated "radial" signal lines 30, a common group of "bus" signal lines 32, and a group of seventy inter-processor lines 33. The bus lines comprise a common group of the signal lines that is accessible through the peripheral electrical connectors by the peripheral modules. In contrast, the radial lines are divided and connected in exclusive groups or sets to individual peripheral modules—the radial is signal lines of each set are unique to that set. Inter-processor lines 33 connect only between the CPU module 17 and primary FPGA 20.

The peripheral modules are generally divided into "large" modules 14 and "small" modules 15. The large modules are characterized by the higher number of radial lines to which they are connected, and by the fact that they are connected to the bus signal lines. In the embodiment described herein, there are three large modules 14. Each of these is connected in common to sixty-four bus lines 32 from primary FPGA 20. In addition, each large module is connected to a unique set of radial lines 30. Specifically, two of the large modules are connected to twenty dedicated radial lines, respectively, while the remaining large module is connected to thirty-six different radial lines.

There are eleven small modules 15 in the embodiment described herein. Each of eight of these small modules is connected to ten of the radial lines. That is, each of these small modules is connected to access a different set of ten radial lines. Each of the remaining three small modules is similarly connected to access a different set of five radial lines.

Power supply module 18 is connected through connectors 29 to access eight dedicated radial lines.

One or more of connectors 29 are for connection to CPU module 17. These connectors allow all of the sets of signal lines to be accessed by a CPU on the CPU module. Specifically, the CPU module is connected to all of the radial signal lines. In addition, the CPU module is connected to all of the bus lines. Because of this, the CPU on the CPU module can be connected to any of the bus signal lines and to any of the radial signal lines. More generally, the CPU can be connected to any of the primary FPGA signal lines. This feature makes it very easy to move functionality from the FPGA to the CPU—all that is required is to reprogram the FPGA and connect the CPU to the appropriate lines that were formerly controlled by the FPGA. Once this is done, the CPU can control the signal lines in place of the FPGA.

As mentioned briefly above, base module 12 has support components that are used only during development of the target system. For example, the base module has a plurality of power monitors 26. In the embodiment described herein, there are twenty-six power measurement circuits: one for each small module, two for each large module, two for the CPU module, and seven for the power supply module. Each circuit integrates total measured charge over time using an integrated circuit from Benchmarq Inc. of Carrollton, Tex. (part number bq2004). These circuits allow power consumption of the various modules to be measured.

Power supply module 18 is designed to emulate the actual power supply that will be used in the target system, and therefore includes a rechargeable battery source as well as circuitry for recharging the battery source. In addition, the power supply module supplies independent power to all the development support circuits, so that these circuits which are not to be present in the target system do not draw from the rechargeable battery source.

Housekeeping FPGA 28 is connected to the various development support components such as the LED display, the parallel port, and the power monitors. Housekeeping FPGA 28 is programmed to control communications through parallel port 24, and to allow data to be downloaded through parallel port 24. Housekeeping FPGA 28 has further connections to primary FPGA 20. This allows housekeeping FPGA 28 to program primary FPGA 20 based on data supplied through parallel port 24 from an external source. Housekeeping FPGA 20 allows data from power monitors 26 to be read by an external device through parallel port 24.

The peripheral modules can perform any functions that will be implemented in the target system. In one system, the large modules include a memory card and a PCMCIA card. The small modules include an infrared communications card, a serial communications card, a combination card for touch screen, modem, and sound functions, and a keyboard controller.

It is advantageous for the memory card to contain flash memory that emulates ROM (read-only memory). This would be replaced by actual ROM in the target system. In the development system, it is advantageous to allow the flash memory to be programmed through parallel port 24 and housekeeping FPGA 28.

Note that many of the functions that would normally cards can be implemented on primary FPGA 20. Communications with the cards does not have to take place over a pre-defined bus structure. Rather, the radial lines dedicated to each card can be used in any desired way. For instance, a serial card could use its radial lines as actual serial data lines, controlled by a UART (universal asynchronous receiver/transmitter) implemented within primary FPGA 20. The serial card itself would only need to provide electrical level conversion and a connector to a serial device. If the UART were eventually implemented within a CPU, the CPU could be connected to these same radial lines, and the CPU's UART could then function in place of the UART previously implemented on primary FPGA 20.

Target System Hardware

Figure 3:
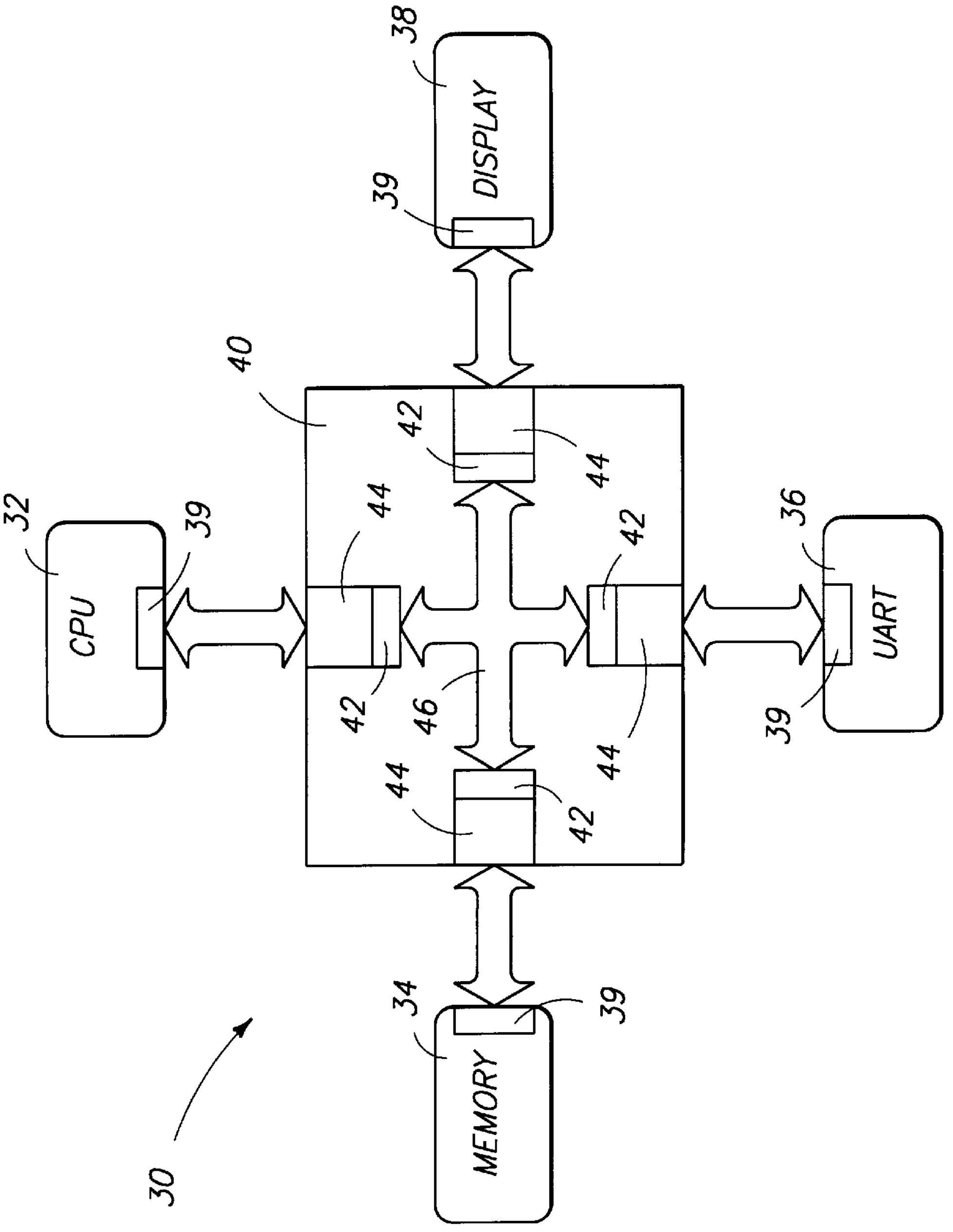
FIG. 3 is a block diagram of a computer system in accordance with a preferred embodiment of the invention.

FIG. 3 shows a target computer system 30 designed in accordance with a preferred embodiment of the invention. Computer system 30 includes a plurality of discrete computer components, such as a CPU 32, memory 34, a serial communications controller or UART 36, and a visual display controller 38. Each discrete component has its own signal interface 39, comprising a set of physical signal connections, having pre-specified logical and electrical characteristics and requirements. During development, these discrete components are implemented on different peripheral modules, and the signal interfaces are implemented by the bus lines and/or radial lines.

Computer system 30 also includes component interface hardware between the discrete computer components. In the preferred embodiment of the invention, the component interface hardware comprises a single FPGA or application-specific integrated circuit (ASIC) 40 that interfaces between the computer components. More specifically, the hardware comprises a field-programmable gate array such as part number EPF10K50GC403-5 from Altera Corporation of San Jose, Calif. ASIC 40 interfaces between the discrete computer components, essentially translating or converting between the various signal interfaces of the components. ASIC 40 corresponds to FPGA 20 described above with reference to FIG. 2.

ASIC 40 includes an internal hardware interface 42 corresponding to each respective computer component. The internal hardware interfaces are selected from a limited number of available pre-defined internal hardware interfaces for general kinds of discrete computer components.

The internal hardware interfaces are generally provided or pre-defined as standards. One of these interfaces is to be used for each discrete component that requires connection to or through ASIC 40. An interface of a particular type can generally be replicated any number of times in a particular design. Preferably, only a small number of internal interface types (such as three or four) are made available for use in a particular system.

In the preferred embodiment, there are three different available pre-defined internal hardware interfaces: a CPU/memory interface, a register interface, and a master interface. The CPU/memory interface is used in conjunction with CPUs and memory components. The register interface is used in conjunction with discrete components requiring simple read/write access to other components. The master interface is used in conjunction with discrete components requiring direct memory access (DMA) functionality. For a specific computer design, one pre-defined internal interface corresponds to each external component.

The internal hardware interfaces are generally accessible only within ASIC 40. They do not have signals or connections that can be used directly by the discrete components external to ASIC 40. Furthermore, the internal interfaces do not necessarily comply with the requirement of the interfaces of any of the external components. Thus, external components are not connected directly to their corresponding internal hardware interfaces. Rather, ASIC 40 includes component-specific hardware interfaces 44 corresponding to the respective discrete computer components. The component-specific hardware interfaces connect between the pre-defined internal hardware interfaces 42 and the signal interfaces 39 of the discrete computer components.

Component-specific hardware interfaces 44 have two types of signals: external interface signals and internal interface signals. The external interface signals are presented at external ASIC connections, for connection to the signal interfaces of external components, while the internal interface signals are connected to the pre-defined internal hardware interfaces.

The component-specific hardware interfaces are designed individually for the different discrete computer components to interface the components to internal hardware interfaces 42—each different kind of computer component generally requires a unique component-specific interface. The component-specific hardware interfaces are designed to provide interface translation or conversion between the signal interfaces of external components and the internal signals of internal hardware interfaces 42.

ASIC 40 further includes conventional interconnection logic 46 between the internal hardware interfaces, providing data communications and control functions between the internal hardware interfaces. This, in turn, allows communications between the component-specific hardware interfaces and between the corresponding external computer components. Interconnection logic 46 uses signal channels that are multiplexed within ASIC 40. Such multiplexed signal channels include, for example, an address channel, a data channel, and various control signals related to data transfer and to component or memory addressing. The interconnection logic includes addressing logic. Each internal hardware interface is assigned its own address or range of addresses so that it can be selectively accessed by a CPU or master component. The interconnection logic and internal hardware interfaces are designed in such a way that internal hardware interfaces can be conveniently replicated without involving significant additions to interconnection logic 46.

The configuration of FIG. 3 provides a distinct advantage over prior art designs. Using this configuration, a component-specific interface can be designed once for a particular component, to connect that component to a standard internal hardware interface. During development using the development system described above, a manufacturer or designer provides a peripheral module and a corresponding component-specific interface. Once designed, the component-specific interface can be used in any system that is configured to use the same standard internal hardware interface. In some cases, manufacturers might provide design specifications for component-specific hardware interfaces for use with the manufacturers' own components, such as hard disks, modems, IR communication devices, etc. Designing a computer system with an interconnecting ASIC then involves simply configuring the ASIC in accordance with the provided component-specific hardware interfaces and the appropriate pre-defined internal hardware interfaces.

Internal Hardware Interfaces

The internal hardware interfaces can be designed in many different ways in accordance with a particular designer's preferences and the goals of a particular product. Generally, each different type of internal hardware interface wilt connect to the internal interconnection logic of ASIC 40 and will also have internal signals for connecting to component-specific hardware interfaces. Designing the internal it hardware interfaces and the interconnection logic between the internal hardware interfaces can be accomplished using conventional design techniques, preferably utilizing popular development tools such as hardware description languages and associated compilers for specific ASICs.

The interface signals presented by standard internal hardware interfaces are preferably similar to those of popular interfaces of discrete components. For instance, the signals presented by a particular internal interface might include multi-bit address and data busses, a clock signal, a signal indicating whether an operation is a read or a write, timing signals indicating the presence of valid data at address and data busses, and other signals such as interrupt or DMA negotiation signals. However, it is not necessary for the internal interfaces to comply with any particular existing interface standard in order to be compatible with existing discrete components. Rather, it is advantageous to standardize on a particular style of interface or a limited set of internal interfaces for use within a particular ASIC, and to convert the interfaces of external discrete components using component-specific interfaces designed especially for that purpose.

The preferred embodiment of the invention utilizes only three different types of pre-defined internal interfaces. Each of these uses similar interface signals.

The preferred internal hardware interfaces include an internal CPU/memory interface. This type of interface is used in conjunction with a CPU and with one or more memory components. There are two distinct parts to the CPU/memory interface: the CPU interface and the memory interface. The CPU interface provides a path for a CPU to access other computer components connected through ASIC 40. The memory interface is used with memory components so that they can be accessed by the CPU interface or by other components. These two logical interfaces are implemented in a single pre-defined internal interface so that a designer can optimize the path and interconnections between the CPU and memory. A designer of component-specific hardware interfaces for a CPU and memory might decide to access memory through the internal CPU and memory interfaces. Alternatively, the designer might provide a faster, more direct path is between CPU and memory through a component-specific hardware interface designed specifically for the CPU and memory. In this case, the CPU will still access other components through the internal CPU/memory interfaces.

External components other than memory and CPUs are used in conjunction with pre-defined internal register interfaces or master interfaces, depending on the function and complexity of required data transfer transactions. Most simple external components can operate in conjunction with an internal register interface. External components associated with an internal register interface are not allowed to access memory. They rely on a CPU or a component associated with an internal master interface for data transfers.

External components that need to move data, other than CPUs, are used in conjunction with internal master interfaces. A component associated with a master interface can read from and write to any component associated with a register interface. In the preferred embodiment of the invention, an internal master interface incorporates one or more ring buffers that can be used for direct memory access (DMA). The interface signals presented by a master interface include signals used to facilitate DMA transfers.

As an example of a typical interface specification, the signals defined by a it pre-defined memory interface are listed and described below. These signals are presented internally within ASIC 40, and are used by a component-specific interface connected to a memory component. Although the details of the various interface specifications are not central to the invention, they serve to illustrate one type of internal interface that might be specified for a particular general type of external component.

Write Data Signal (d). This is a multi-bit signal used for transferring data to memory from the internal memory interface. Its width is either 16 or 32 bits, defined on a per-system basis.

Read Data Signal (q). This is a multi-bit signal used for reading data from memory, to the internal memory interface. Its width is the same as that of the write data signal.

Address Signal (a). This is a multi-bit signal used to specify addresses to the memory component associated with the internal memory interface. Its width is defined on a per-system basis, although not all bits will generally be used by any particular memory component.

Write Signal (wr). This single-bit signal indicates the direction of a memory transfer. A true value indicates a write to memory and a false value indicates a read from memory.

Transfer Size (bytes). This multi-bit signal indicates the number of bytes being transferred in a memory transfer.

Read/Write OK (rwOk). This is a single-bit signal indicating that write data is valid on the write data signal (when the write signal is true) or that read data is valid on the read data signal (when the write signal is false).

Interface Select (slot). This single-bit signal indicates when the memory interface is being addressed. The ASIC interconnection logic decodes addresses from other components and asserts this signal as appropriate.

Clock (clk). This is a system clock that oscillates at a rate that is selected for the system. It may be stopped when not being used by the interface to transfer data.

3.6864 MHz Clock (clk386). This is a clock signal that runs continuously when the system is not in reset.

Interrupt (intr). This single-bit signal is true when an interrupt is occurring.

Reset (rst l). This single-bit signal is high during normal operation, and low during a system reset.

Again, these signals are available only within ASIC 40. They are for use by a corresponding component-specific interface implemented within ASIC 40. The component-specific interface provides actual connections to an external component.

Figure 4:
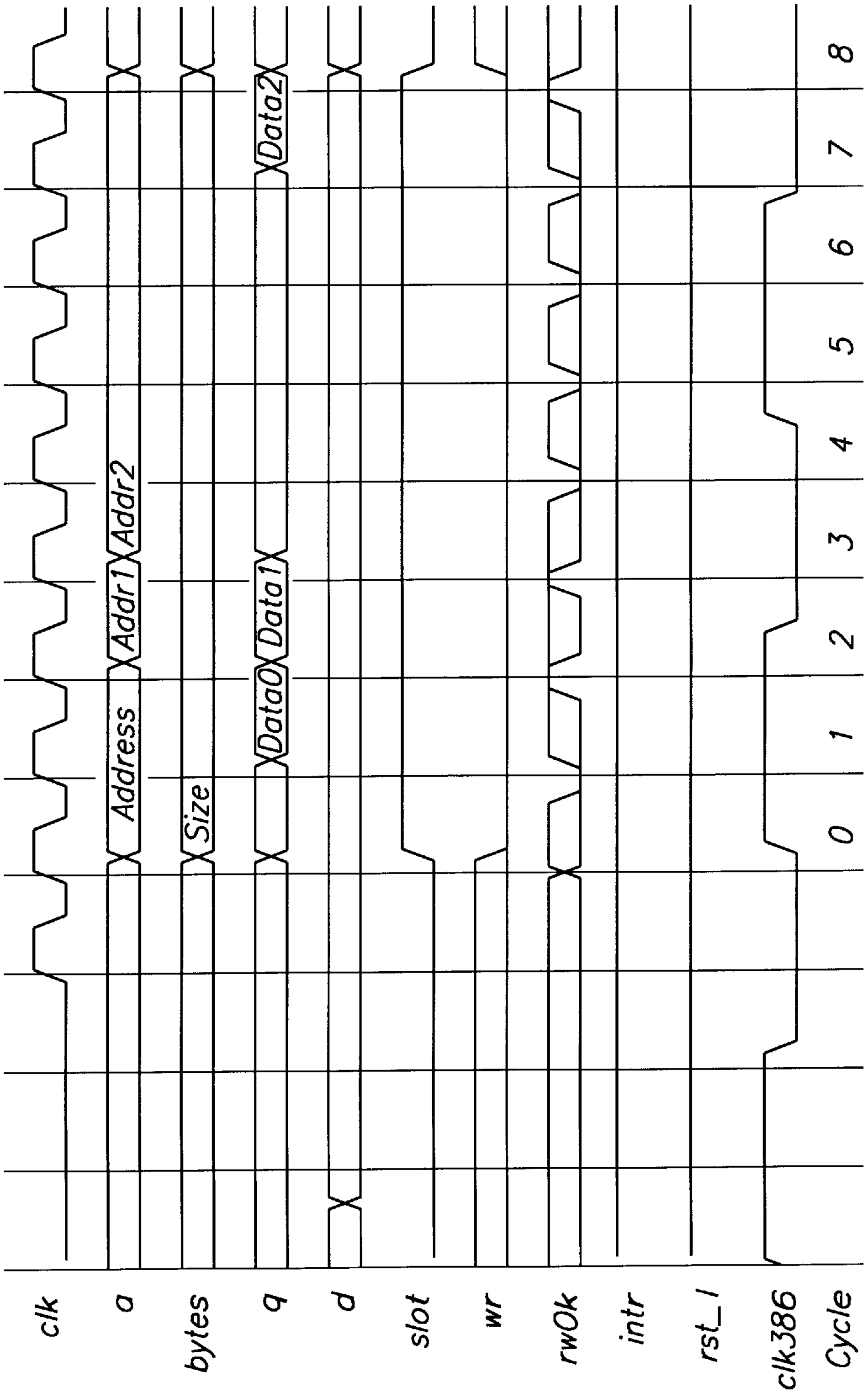
FIG. 4 is a timing diagram showing timing details of a read cycle in an exemplary internal interface.

FIG. 4 shows a timing diagram for a memory interface read transaction utilizing a pre-defined internal memory interface having the signals described above. Note that the clock signal cycles only when an operation is taking place, to conserve power. The component-specific hardware interface connected to the memory interface can thus expect very few transitions of clk before or after a read transaction. Component-specific hardware interfaces associated with the CPU or a master device are responsible for generating the clock signal at appropriate times.

A read transaction occurs when slot is asserted and wr is false (as in cycles 0 through 7 of FIG. 4). Burst operations are allowed, as shown in FIG. 4, but only the lower 8 bits of the address bus are allowed to change during burst transfers. The transfer size signal bytes indicates the number of bytes to be read and the address increment for burst cycles.

In the example of FIG. 4, the connected memory component stalls (fails to respond) during cycle 0 by not asserting rwOk. In cycle 1, rwOk is asserted, indicating that read data is valid on the read data bus. If the memory had not stalled, it could have asserted rwOk and returned read data in cycle 0.

The memory returns valid read data in cycles 1, 2, and 7, as indicated by the asserted state of rwOk. In cycles 3, 4, 5, and 6 the memory stalls with the de-assertion of rwOk.

Figure 5:
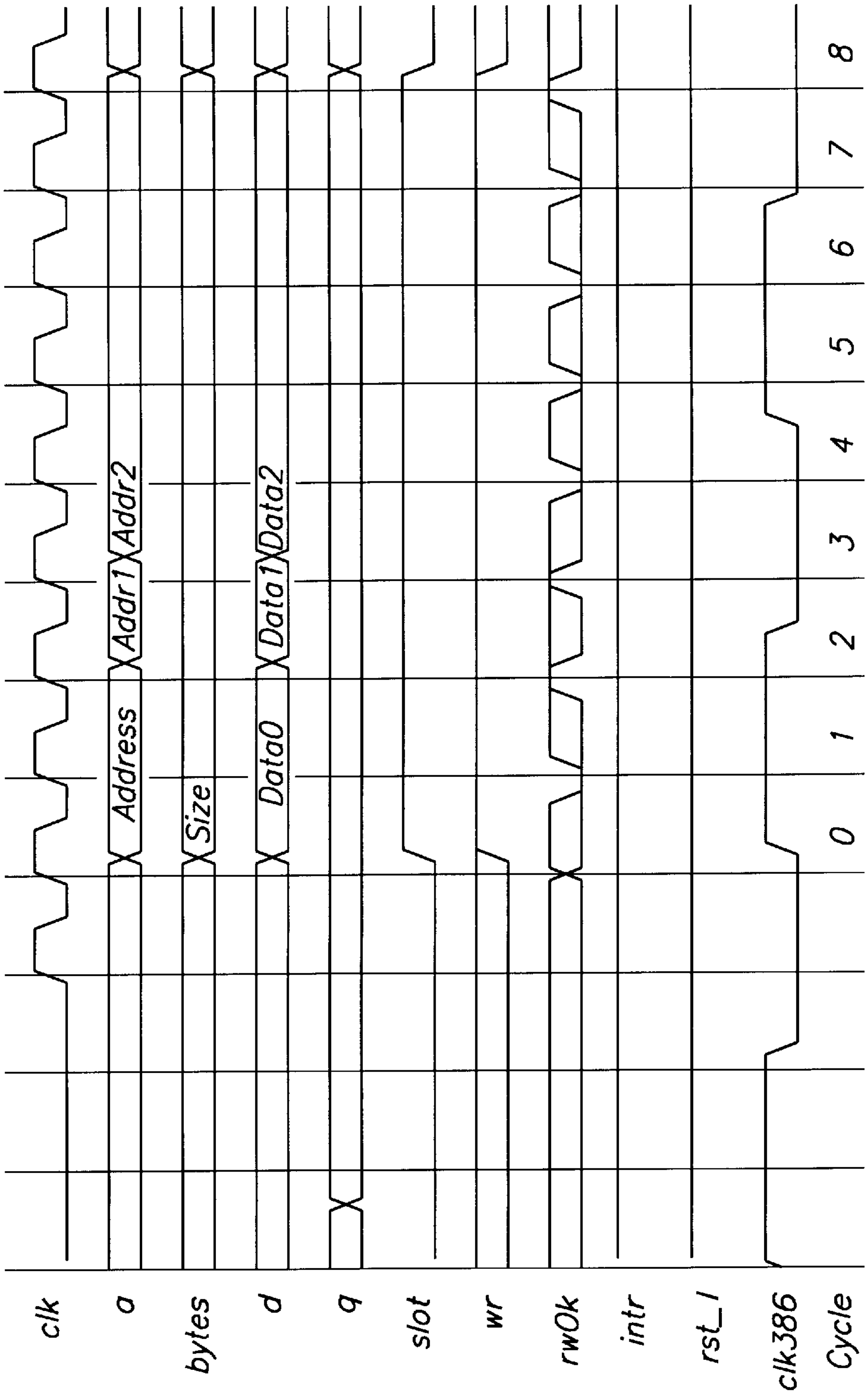
FIG. 5 is a timing diagram showing timing details of a write cycle in an exemplary internal interface.

FIG. 5 shows a timing diagram for a memory interface write transaction. Again, very few transitions of clk occur before or after a write transaction. Only the lower 8 bits of the address bus are allowed to change during burst transactions such as the one shown in FIG. 5. The transfer size signal bytes indicates the number of bytes to be written and the address increment for burst cycles.

In cycle 0 of FIG. 5, the address, transfer size, and write data are all available. However, the memory component stalls in cycle 0 by not asserting rwOk. If the memory had not stalled it could have asserted rwOk and accepted the write data in cycle 0.

In cycles 1, 2, and 7 rwOk is asserted indicating that the memory will accept the written data. In cycles 3 through 6, the memory de-asserts rwOk, indicating that it is not ready to accept the write data. The write transaction completes in cycle 8 when slot de-asserts, with no data being written in cycle 8.

In general, a write transaction occurs when slot is asserted and wr is true (as in cycles 0 through 7 of FIG. 5). There will be at least one cycle where slot is not asserted between transactions.

For all data transfer transactions between an internal hardware interface and a connected component-specific hardware interface, the internal hardware interface and a connected component-specific hardware interface are responsive to a common clock signal. In practice, clk is used in common for all internal hardware interfaces and all component-specific hardware interfaces. Because of this, and because the internal and component-specific interfaces are implemented using identical types of logic components (of a single ASIC), it is not necessary to specify explicit timing constraints for the signals between the internal hardware interfaces and the component-specific hardware interfaces. The component- specific interfaces will automatically comply with any inherent timing requirements of the internal interfaces by virtue of using the same clock signal and the same types of logic components.

Design Methodology

The preferred embodiment of the invention includes a method of integrating a plurality of discrete computer components such as those described above and shown in FIG. 3, and of designing component interface hardware for use between such discrete components. As already described, each discrete computer component has a signal interface with specified logic and electrical requirements. A field-programmable gate array (FPGA) or other ASIC is used to provide interface translation or conversion between the various signal interfaces of the discrete components. These steps are preferably performed in conjunction with the development system described above.

Figure 6:
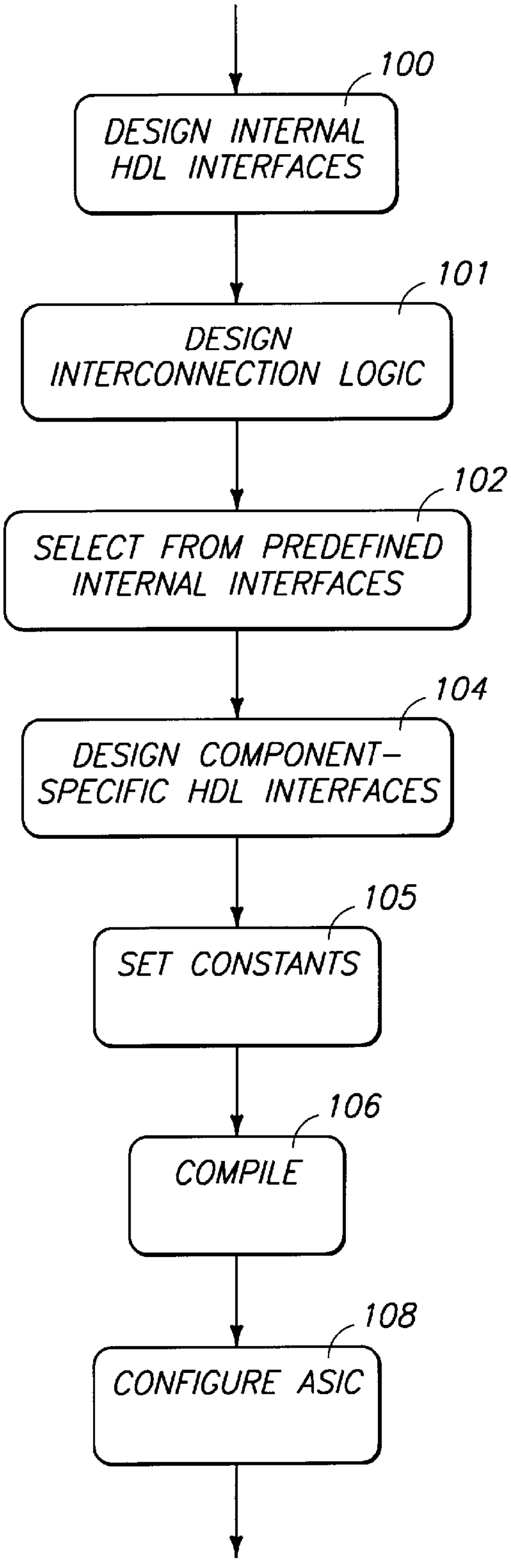
FIG. 6 is a flow chart showing preferred steps in accordance with the invention.

The preferred design methodology utilizes automated design tools to produce an actual physical design specification for an FPGA or other target ASIC. FIG. 6 shows the general preferred steps in accordance with the invention.

A step 100 comprises designing and pre-defining a limited number of available internal interfaces or internal interface types for general kinds of computer components. These interfaces are designed and specified with a hardware description language (HDL) such as VHDL (IEEE Standard 1076-1993) or Verilog®, manufactured by Cadence Design Systems Inc. of California, that can be subsequently compiled or otherwise converted to an actual hardware design specification for an FPGA. Logic designs that are written in an HDL are generally portable in the sense that conversion software can convert or compile HDL descriptions or definitions to create specifications for different physical representations that use alternative hardware components. Specifically, one or more HDL descriptions are used to create an FPGA configuration file for a particular selected FPGA. The FPGA configuration file can then be used to program the FPGA. If desired, the same HDL descriptions can also be used to create a configuration file for a different type of FPGA.

Step 100 might include, for instance, designing three general internal HDL interfaces: one for CPU and memory component types, one for register component types, and one for master component types.

The internal HDL interfaces are generally accessible only within the target ASIC on which the design is eventually implemented. More specifically, each internal interface presents a set of interface signals. These signals, however, are internal signals and are not directly accessible by components external to the target ASIC.

A step 101 comprises designing interconnection logic using one or more HDL or VHDL descriptions. The interconnection logic is preferably designed and provided as part of a standard package along with the pre-defined internal interfaces. It defines communications paths or structures between the various pre-defined internal HDL interfaces.

A subsequent step 102 comprises selecting pre-defined internal HDL interfaces for respective individual discrete computer components. These internal interfaces are selected from the available interfaces designed as standards in step 100. There is not necessarily a unique type of internal interface for each discrete computer component. Rather, an internal interface of a particular type might be replicated several times for use with a number of different external components.

A step 104 comprises designing component-specific HDL interfaces for connecting the individual discrete components to the selected pre-defined internal HDL interfaces. These component-specific interfaces are designed using the same hardware description language as used to design the pre-defined internal HDL interfaces—such as VHDL. Each component-specific HDL interface defines a set of external interface signals for connection to the signal interface of a particular external computer component. These signals are external in the sense that they are available at actual pins of the target ASIC, and can be accessed directly by the external computer components.

The component-specific HDL interfaces additionally define a set of internal interface signals. These signals are internal to the target ASIC. They correspond to and are internally connected to the internal interface signals of the corresponding pre-defined internal HDL interfaces. The component-specific HDL interfaces define conversion logic between the external and internal interface signals.

A step 105 in accordance with the invention comprises setting constants relating to features of the internal interfaces and the interconnection logic. This step will be described in more detail below.

A step 106 comprises converting the selected internal HDL interfaces and the designed component-specific interfaces to create an actual physical design for an integrated circuit. More specifically, the HDL interfaces are compiled to create an ASIC-specific hardware configuration file. This step is performed using HDL compilation software such as the Synopsys® compiler available from Synopsys, Inc.

In practice, step 106 comprises submitting a number of VHDL description files to a VHDL compiler. The VHDL description files include files that describe the component-specific interfaces, the pre-defined internal interfaces, and the interconnection logic.

Step 108 comprises actually configuring an FPGA or other component interface hardware based on the selected pre-defined internal HDL interfaces and the designed component-specific HDL interfaces. This step is performed with available programming hardware for the selected ASIC, using the ASIC-specific hardware configuration file produced in step 106.

The internal interfaces and the associated interconnection logic are preferably designed once, and then used without further modifications for different designs. To design a particular system, the designer selects the appropriate internal interfaces, and either designs appropriate component-specific interfaces or selects from component-specific interfaces that have already been designed.

Some flexibility in the pre-defined interfaces can be provided in the form of certain features that can be specified by the designer, after selecting the internal interfaces that are to be used in a particular system. Specifically, certain features are specified in terms of constants that can be set or specified by a designer without logical modifications to the pre-defined internal interfaces. These features include the width of certain data paths or channels, as well as addresses and certain buffer widths. Other such features include specifications of connection signals between the component-specific HDL interfaces and the selected pre-defined internal HDL interfaces. The constants that specify these features are set in step 105 above. The step of setting these constants and of designing the component-specific interfaces are preferably performed contemporaneously, so that the variable features can be specified depending on requirements of the component-specific interfaces and of the connected external components.

For example, most component-specific interfaces are associated with an address or a range of addresses. Address decoding, however, is accomplished by the pre-defined internal interfaces or by pre-defined interconnection logic. To enable a designer to specify a desired address or range of addresses, the addresses are specified in terms of constants that can be set by the designer without otherwise modifying the pre-defined HDL interfaces.

Data path widths, or widths of other multi-bit signals, serve as another example of a feature that can be specified by a system designer without having to significantly alter the pre-defined HDL interfaces. In the preferred embodiment of the invention, the interconnection logic has internal address and data paths or channels that are accessed indirectly by external components and by the component-specific interfaces. The widths of the data paths or channels can be specified by a system designer by simply setting the value of constants.

The preferred embodiment of the invention thus includes steps of defining a multi-bit signal in a particular one of the pre-defined internal HDL interfaces; defining a width constant that is associated with the pre-defined internal HDL interface to specify a width for the multi-bit signal; and assigning a value to the width constant. The multi-bit signal and constant are defined while designing the pre-defined internal interfaces. The constant is assigned a value, however, while designing the component-specific interfaces.

A DMA buffer is another example of a feature that can be partially specified in terms of a constant that is set after selecting the pre-defined internal interfaces. In the preferred embodiment, some DMA functions are integrated in the master interface. Specifically, the preferred implementation of the master interface includes a DMA buffer, the width of which can be set by a system designer without delving into the details of the internal master interface.

Figure 7:
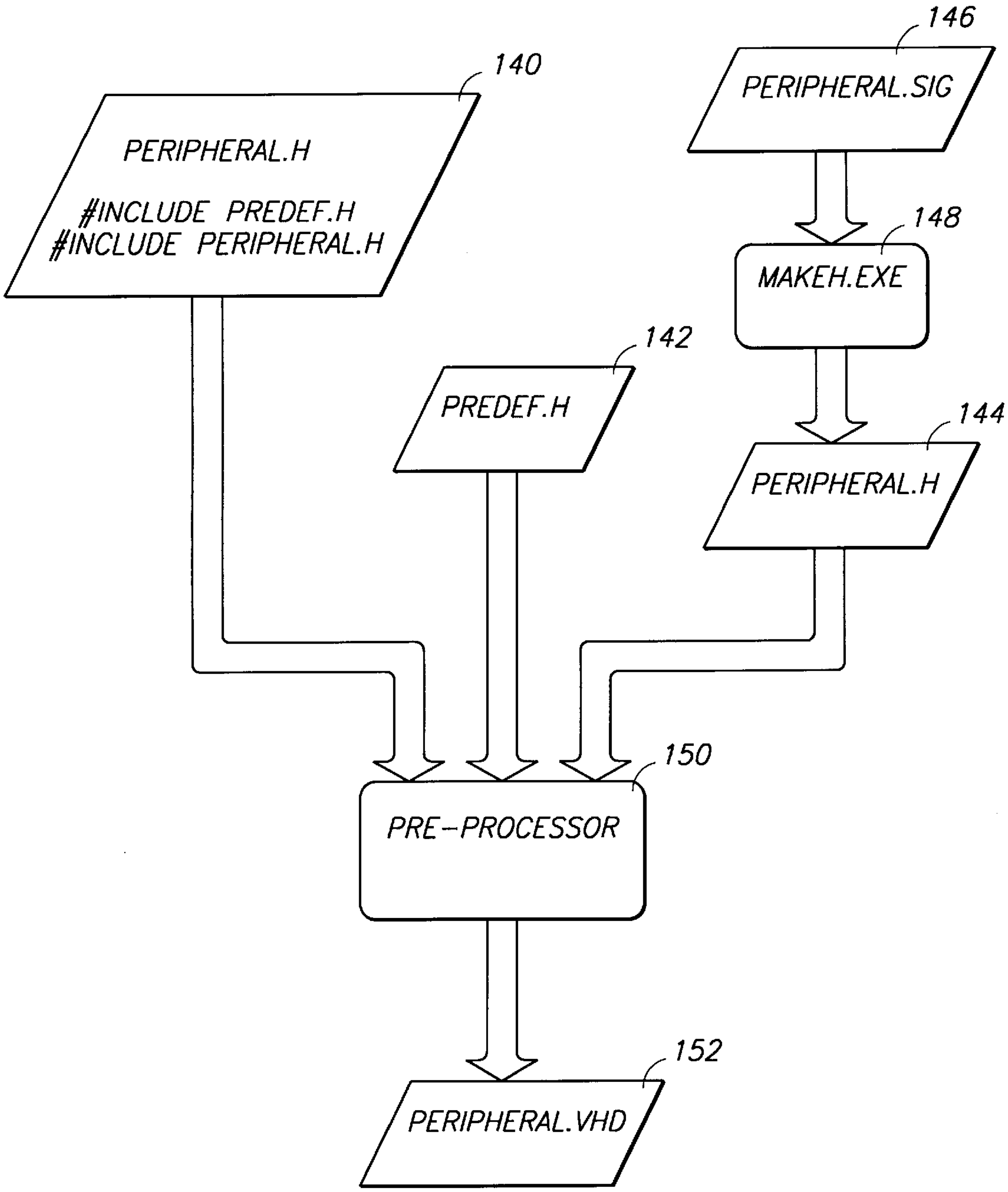
FIGS. 7 and 8 are data flow diagrams showing further preferred steps in accordance with the invention.

FIGS. 6 and 7 illustrate a practical process of creating an ASIC-specific hardware configuration file in accordance with one implementation of the invention. Although the steps described above can be implemented manually, the process of FIGS. 6 and 7 automates the design steps to some degree.

A designer creates a component-specific HDL interface by writing an interface description in a hardware description language such as VHDL. Such an interface description is contained in a text file such as file 140 in FIG. 7, in this case named "peripheral.v". Interface description files will be uniquely named for different external components.

In the preferred embodiment, the interface description for a particular component-specific HDL interface incorporates or "includes" two separate files that define connections to an external component and to the corresponding pre-defined internal interface. In FIG. 7, these files are named "predef.h" and "peripheral.h", and are indicated by reference numerals 142 and 144, respectively.

The file predef.h is an internal port definition file in VHDL format. This file is pre-defined along with the pre-defined HDL interface to which the component-specific internal interface is to be connected. It specifies port definitions for the pre-defined internal interface. The filename of this file will vary, depending on the type of pre-defined internal interface that will be used with the component-specific HDL interface. For instance, if the pre-defined internal interface is a register interface, peripheral.h might "include" a pre-defined file named "register.h" containing the internal port definitions for an internal register interface.

The file peripheral.h is a port definition file written in VHDL format by the designer of the component-specific HDL interface. It contains external port definitions for the interface to the external component. This file will normally have a filename corresponding to that of the component-specific HDL interface. For instance, a VHDL description of a component-specific interface for a serial port might consist of the files "serial.v" and "serial.h".

Rather than writing peripheral.h directly, a designer actually creates a file 146 named "peripheral.sig" in a non-VHDL format. The file peripheral.sig specifies port definitions and other information used to eventually create an ASIC-specific hardware configuration file. Listing 1 shows an example format for peripheral.sig:

| // | Name | PortName | Dir. | Type | Association |
|---|---|---|---|---|---|
| | TX | tx | out | none | std_logic |
| | RTS | rts | out | none | std_logic |
| | DTR | dtr | out | none | std_logic |
| | RX | rx | in | none | std_logic |
| | CTX | cts | in | none | std_logic |
| | CD | cd | in | none | std_logic |
| | SerPwr_1 | ser_pwr_1 | out | none | std_logic |

Listing 1

In this file, the characters "//" indicate comment lines. Each non-comment line indicates the local and non-local names of a particular externally-available signal, as well as information relating to the electrical characteristics of the signal. Additional fields, not shown, can be provided to indicate further information about particular signals, such as pin location on the target ASIC.

To convert peripheral.sig to a VHDL format, it is operated on by a custom program 148 referred to in FIG. 7 as "makeh.exe". This program is configured to extract relevant information from peripheral.sig and to format such information in conformance with VHDL standards—resulting in the file peripheral.h.

The two files predef.h and peripheral.h are "included" in peripheral.v by means of an #INCLUDE statement in peripheral.v. #INCLUDE is conventional pre-processor directive typically used in C programming to incorporate the contents of one file into another file. A C programming environment typically includes a pre-processor to perform the actual incorporation of textual material. In this case, the file peripheral.v is operated on by a conventional C language pre-processor 150 to implement the #INCLUDE statements of peripheral.v. The result is a file 152 named "peripheral.vhd", comprising the original peripheral.v, in addition to the textual contents of predef.h and peripheral.h. The file peripheral.vhd is a VHDL file that defines a single instance of a component-specific hardware interface.

Instances of pre-defined HDL internal interfaces are created using a similar process. For instance, a pre-defined register interface is defined using a VHDL-formatted file named "register.v". The file register.v includes, using an #INCLUDE statement, a port definition file "register.h". The file register.h is created with the makeh.exe program from a file named "register.sig" having a format similar to that shown in Table 1.

As each component-specific hardware interface of a computer particular system is defined, it is documented in a file named "makefpga". An example of a makefpga file is shown in Table 2. Comment lines are indicated by the characters leading positions.

```
// This file is used by makesys to define what modules go into
// the FPGA wirelist and how the modules are to be connected.
//
// The first entry, ModuleName defines the base file name for all the
// modules associated design files..ie
//    fileName.v       VHDL Model for Module
//    fileName.sig     External Signal Names
//
// Module Type
//    Defines what sort of module this is. Each ModuleType
//    Has a specific pre-defined internal FPGA interface.
//
//    CpuMem      - CPU and Memory Interface Module, must be a master.
//    busMaster   - Bus Mastering Interface must have slot space and mastering
//    register    - Register Interface. Must have slot assignment, no mastering.
//    isr         - Required System Module
//    Arbiter     - Required System Module
//
//
// Master
//
//    Indicates what DMA channel that this bus master is and
//    What its priority is.
//
//    Master (Prio)
//    0 - Lowest priority, Default winner (if no one is requesting).
//    1 - Highest priority
//    2 - Next Highest Priority
//
//    Types must be either lsr ArbMux CpuMem Register or Master
//
//
// Some CPU interface must be present
Module
{
   Name            sh3;
   Type            CpuMem;
   Master          none;
   Slot            0;
      SlotBase     0x10010000;
      SlotMask     0x0001F000;
   DatapathWidth   16;
   AddressWidth    29;
}
```

-continued

```
// System module ISR must be present
Module
{
    Name          Isr;
    Type          Isr;
    Master        none;
    Slot          1;
      SlotBase    0x10000800;
      SlotMask    0x00000800;
}
// System module ArbMux must be present
Module
{
    Name          ArbMux;
    Type          ArbMux;
    Master        none;
    Slot          none;
}
// Serial interface 0
Module
{
    Name          ser;
    Type          Master;
    Slot          2;
      SlotBase    0x10002000;
      SlotMask    0x0000f800;
    Master        0;
    WrapBit       11;
    TcBit         10;
    ClrBit        10;
}
// Serial interface 1
Module
{
    Name          ser;
    Type          Master;
    Slot          3;
      SlotBase    0x10003000;
      SlotMask    0x0000f800;
    Master        1;
    WrapBit       11;
    TcBit         10;
    ClrBit        10;
}
// PCMCIA 0
Module
{
    Name          sh3Pcm;
    Type          Register;
    Master        none;
    Slot          4;
      SlotBase    0x10004000;
      SlotMask    0x0000f800;
}
// PCMCIA 1
Module
{
    Name          sh3Pcm;
    Type          Register;
    Master        none;
    Slot          5;
      SlotBase    0x10005000;
      SlotMask    0x0000f800;
}
```

Listing 2

The listing is largely self-explanatory. There is a section for each component-specific interface. Within each section, there is an entry specifying the name of the component-specific interface (corresponding to the names of the files in which the interface is defined), the type of internal interface to which the component-specific interface will connect (cpu/memory, master, or register), and addressing information for the external component which will connect to the component-specific interface. The address, also referred to as a "slot," is specified using a "slot" number, a base address specification and a corresponding mask specification.

The makefpga file contains the settings for constants that can be specified by a designer, relating to variable features of the pre-defined internal hardware interfaces. For instance, addresses of the various hardware elements are specified as constants in the makefpga file. Also, the width of certain signals, such as data and address signals, are specified as constants in the makefpga file. These constants can be set by a designer after the pre-defined internal HDL interfaces are designed and selected. For master interfaces, DMA options can be set, such as sizes for ring buffers and the number of bits to clear on resetting the DMA channels.

The makefpga file lists two required interfaces, named Isr and ArbMux. These interfaces are actually definitions of interconnection logic to connect between the selected pre-defined internal hardware interfaces. The Isr and ArbMux interfaces are implemented in a process similar to that shown in FIG. 7 to result in VHDL files "arbmux.vhd" and "isr.vhd". They are typically provided as part of a pre-defined package, along with the pre-defined interfaces.

Figure 8:
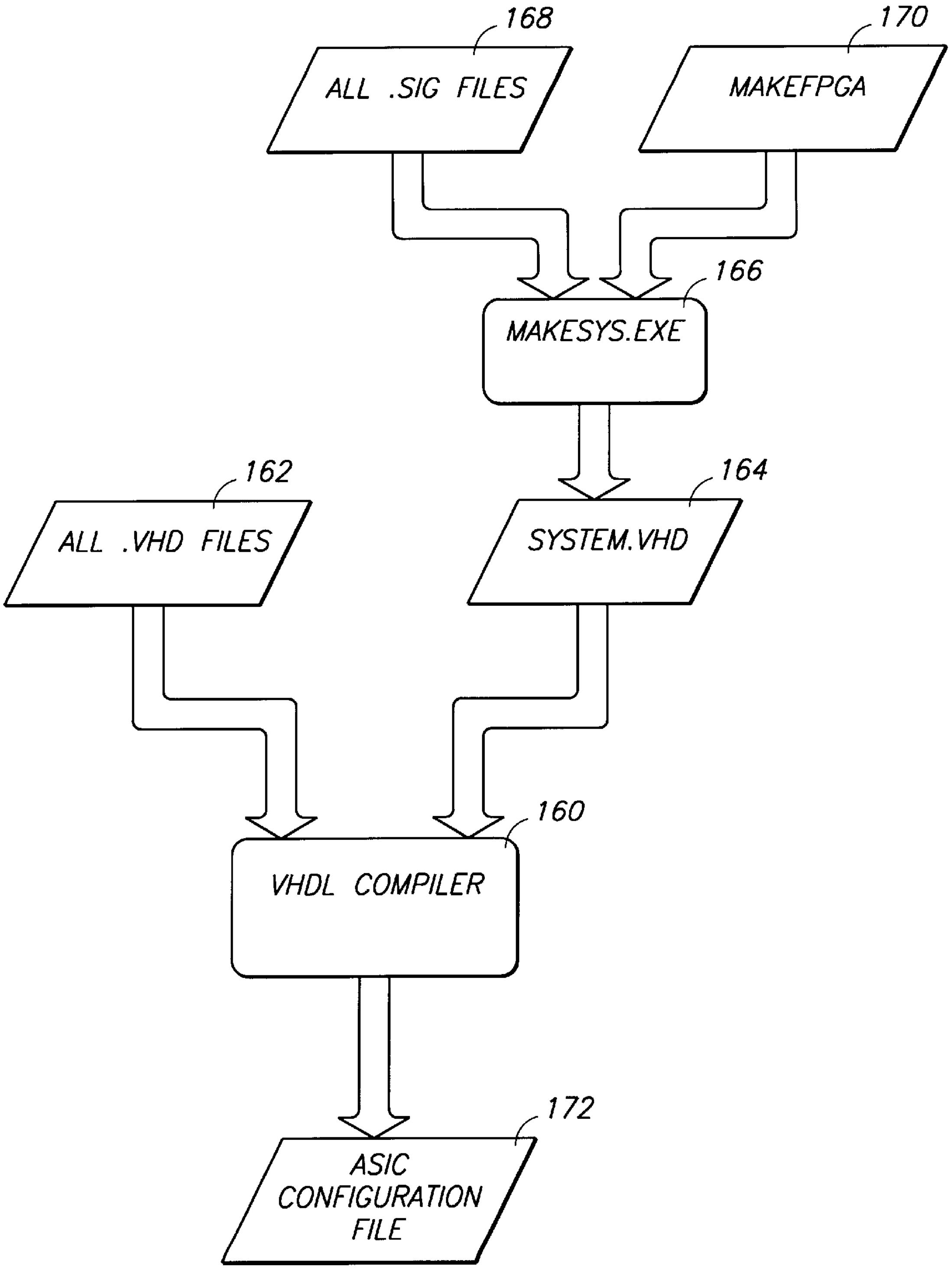

FIG. 8 illustrates further procedures in a process of creating an ASIC-I specific hardware configuration file 172. These procedures include a process 160 of compiling all the VHDL files created as already described. For instance, all peripheral.vhd files created by the designer of component-specific interfaces are included in this process, as well as arbmux.vhd and isr.vhd. These files are indicated in FIG. 8 by box 162. In addition, a system file 164, named "system.vhd", is compiled. The file system.vhd contains a VHDL description of interconnection logic 46. It is uniquely created for a particular system with a program 166 named "makesys.exe." The program makesys.exe reads the various peripheral.sig files, as well as files arbmux.sig and isr.sig, associated with arbmux.vhd and isr.vhd. These files are indicated in FIG. 8 by reference numeral 168. It also reads the configuration information contained on the makefpga file 170. Program makesys.exe creates VHDL file system.vhd based on the information contained in these files. Program makesys.exe replicates internal interfaces as required and configures interconnection logic to be compatible with the components specified in the makefpga file.

CONCLUSION

The invention provides a needed expedient for designing computer systems which are constantly evolving. The components in such systems change frequently, with accompanying changes in their signal interfaces. Using the system described above, new components can be quickly incorporated into an existing design without significant modifications to the "glue" logic that interfaces between the components.

Using the development system, a new part can be incorporated in a design by providing a component-specific HDL interface and an accompanying peripheral module. In addition, many of the logic functions that would conventionally have been provided on the module can now be provided in the system's FPGA. Using the unique architecture of the invention, the logic can be provided by the manufacturer of the new part, and incorporated in the FPGA by the designer of the target system.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

It is claimed:

1. A development system comprising:

a single-chip component interface having a plurality of sets of configurable and externally accessible signal lines;

a plurality of peripheral modules that are external to the single-chip component interface, each of the peripheral modules being connected to a respective unique set of the plurality of sets of configurable and externally-accessible signal lines, the peripheral modules also being connected in common to a common set of the configurable and externally-accessible signal lines;

a CPU module, wherein the CPU module has connections to all of the sets of configurable and externally-accessible signal lines;

the single-chip component interface having internal hardware interfaces corresponding to respective peripheral modules, the internal hardware interfaces being accessible only within the single-chip component interface, wherein the internal hardware interfaces are selected from a plurality of pre-defined internal hardware interfaces for general kinds of computer components;

the single-chip component interface further including interconnection logic between the internal hardware interfaces;

the single-chip component interface further including component-specific hardware interfaces for configuring the plurality of sets of configurable signal lines to which the peripheral modules are connected, the component-specific hardware interfaces connecting the peripheral modules to the internal hardware interfaces;

the component-specific hardware interfaces being designed individually for the different peripheral modules to interface the peripheral modules to the internal hardware interfaces;

wherein a CPU on the CPU module can be connected to any lines of the sets of the plurality of sets to control such interface lines in place of the single-chip component interface.

2. A development system as recited on claim 1, wherein the single-chip component inerface is a programmable gate array.

3. A development system as recited in claim 1, wherein the peripheral modules are removable and replaceable.

4. A development system comprising:

a logic module having a single-chip component interface, the single-chip component interface having internal hardware interfaces and a plurality of sets of configurable and externally-accessible interface lines, the internal hardware interfaces being accessible only within the single-chip component interface, wherein the internal hardware interfaces are selected from a plurality of pre-defined internal hardware interfaces for general kinds of computer components;

the single-chip component interface having component-specific hardware interfaces for connecting peripheral modules to the internal hardware interfaces;

a plurality of peripheral electrical connectors for connection to the peripheral modules, wherein a unique set of the plurality of sets of configurable interface lines is accessible through the peripheral electrical connectors by each of the peripheral modules respectively, and wherein a common set of the configurable and externally-accessible interface lines is accessible through the peripheral electrical connectors by all of the peripheral modules; and one or more CPU electrical connectors for connection to a CPU module, wherein the sets of configurable interface lines are accessible through the one or more CPU electrical connectors, and wherein a CPU on the CPU module can be connected to any lines of the sets of interface lines to control such interface lines in place of the component interface hardware.

5. A development system as recited in claim 4, wherein the single-chip component interface is a gate array.

* * * * *